United States Patent [19]

Torti et al.

[11] Patent Number: 5,391,919
[45] Date of Patent: Feb. 21, 1995

[54] SEMICONDUCTOR POWER MODULE WITH IDENTICAL MOUNTING FRAMES

[75] Inventors: Aldo Torti, Sancarlo Can; Emilio Mattiuzzo, Cirie, both of Italy

[73] Assignee: International Rectifier Corporation, El Segundo, Calif.

[21] Appl. No.: 141,402

[22] Filed: Oct. 22, 1993

[51] Int. Cl.[6] .................. H01L 29/91; H01L 25/03; H01L 21/52; H01L 21/60
[52] U.S. Cl. .................... 257/692; 257/724; 257/925
[58] Field of Search ............... 257/690, 692, 693, 694, 257/713, 723, 724, 678, 688, 689, 925

[56] References Cited

U.S. PATENT DOCUMENTS

| | | | |
|---|---|---|---|
| 4,488,167 | 12/1984 | Neidig et al. | 257/693 |
| 4,724,474 | 2/1988 | Duchek et al. | 257/724 |
| 5,280,194 | 1/1994 | Richards et al. | 257/724 |

*Primary Examiner*—Rolf Hille
*Assistant Examiner*—Peter T. Brown
*Attorney, Agent, or Firm*—Ostrolenk, Faber, Gerb & Soffen

[57] ABSTRACT

A semiconductor device module is formed of four identical frame sections which each have a flat base and perpendicularly extending strap terminal. Semiconductor chips are soldered to the center of the top surfaces of each base, and the devices are interconnected by flat brass strips having one end soldered to the top of one chip and the other end soldered to the base of an adjacent section. The base sections lie in a common plane at the bottom of an insulative filled insulation cup. The terminals extend parallel and out of the top of the cup.

18 Claims, 4 Drawing Sheets

SEMICONDUCTOR POWER MODULE WITH IDENTICAL MOUNTING FRAMES

BACKGROUND OF THE INVENTION

This invention relates to semiconductor power modules, and more specifically relates to a novel module structure which has a smaller part count, can withstand an increased insertion force, and has improved resistance to failure due to vibration and improved thermal performance.

Power modules which provide assemblies of semiconductor devices pre-connected within an insulation housing in various circuit arrangements are well known. A typical module is a Type MB, sold by the International Rectifier Corporation, which is a single phase, full wave bridge-connected device having four internally connected diodes mounted within a square housing, with four copper strap terminals extending from the housing, comprising two a-c and two d-c terminals. The strap terminals are adapted for plug-in connection, if desired, and therefore, have sufficient mechanical strength to enable plug-in. The internal diodes (or other semiconductor devices such as thyristors, power MOSFETs, IGBTs, bipolar transistors, or the like) are mounted in pairs as by soldering to two flat spaced horizontal thin flat copper support plates. Two of the four strap terminals extend integrally from the plate, while the other two terminals are necessarily spaced from the plates. A copper jumper strap extends from the bottom of each of these latter terminals and is soldered to the top of two semiconductor devices, one on each of the plates. Thus, the four terminals define the terminals of a full wave, single phase bridge-connected circuit.

The two terminals spaced from the two bases must extend slightly beyond the edge of the top of the first adjacent semiconductor device chip to which they are connected. Consequently, when the device is plugged into a socket, an insertion force is applied along the length of the terminal, causing a rotational force on the portion which overhangs the edge of the first chip. This insertion force, if too high, will cause the fracture of the chip and failure of the module. These devices are also sensitive to vibration forces for the same reason.

A further problem with the prior art device is that the two connection straps which connect the tops of the semiconductor chips in circuit relation with one another are thin copper straps having central stress relief bends. These straps must have a length equal to that of the center-to-center spacing of the chip. Moreover, they anneal during solder-down and tend to work-harden as the straps flex during temperature cycling.

BRIEF SUMMARY OF THE INVENTION

In accordance with the present invention, each semiconductor chip of a module is provided with its own respective mounting frame. The individual mounting frames are identical to one another, and each contains a flat mounting section which receives a chip on its top surface, as by soldering, and each contains an integral terminal strap extension. These frames are mounted on the bottom of the module housing, with the mounting sections disposed in a common plane and spaced from one another.

The top surface of each chip is connected to the mounting section of an adjacent base by identical, thin brass straps, each of which has stress relief bends.

As a result of the novel structure of this invention, insertion force during plug-in of the terminals is now confined within the sturdy mounting frames and is not applied to the chips or connecting straps. Thus, the new device can better withstand insertion force and vibration forces.

Since the connection straps extend from die to adjacent frame, they are shorter in length than the prior art straps and thus have better thermal performance and may be made of brass which does not work-harden like copper and do not anneal during solder-down.

A still further advantage of the invention is that each of the mounting frames is identical, thus simplifying manufacturing and assembly.

Other features and advantages of the present invention will become apparent from the following description of the invention which refers to the accompanying drawings.

DETAILED DESCRIPTION OF THE DRAWINGS

Figure 4:
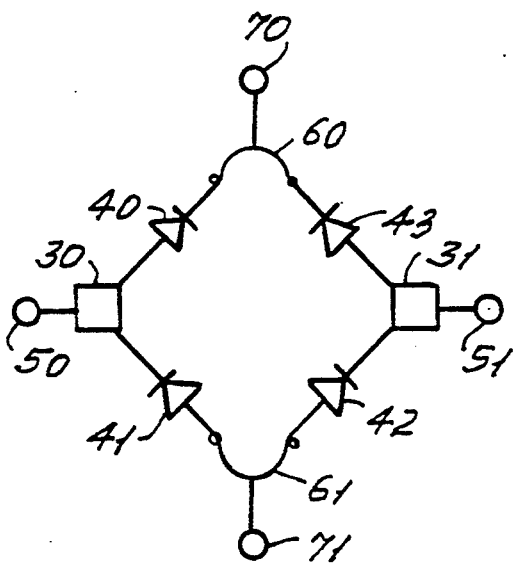
FIG. 4 is a circuit diagram of the circuit formed by the module of FIGS. 1, 2 and 3.

Referring first to FIGS. 1 to 5, there is shown therein a typical prior art power module in which four semiconductor devices are interconnected to form a single phase, full wave, bridge-connected rectifier (FIG. 4). The power diodes are also disclosed as bare chips, interchangeably and commonly also referred to as die or wafers.

Figure 1:
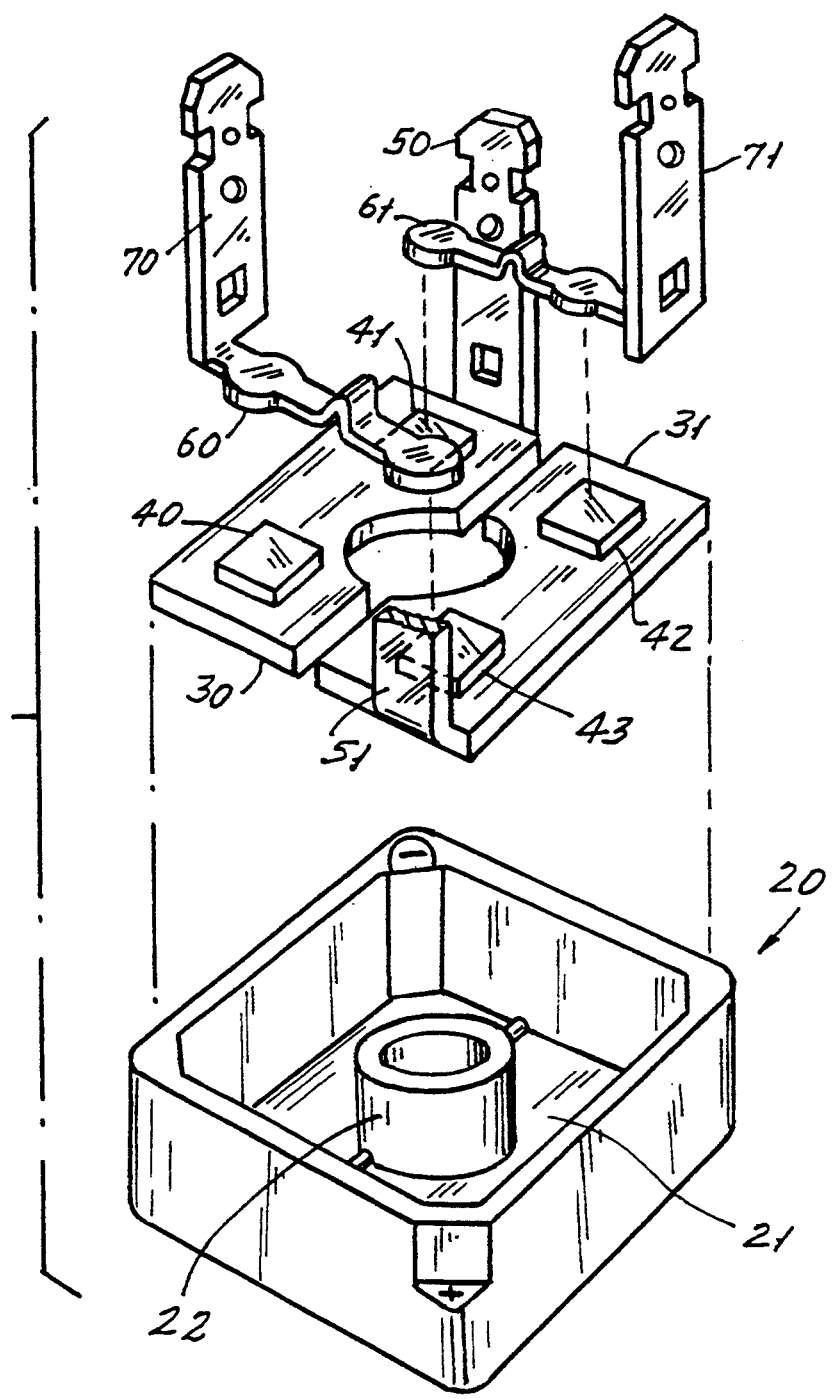
FIG. 1 is an exploded perspective view of a prior art bridge module.
Figure 9:
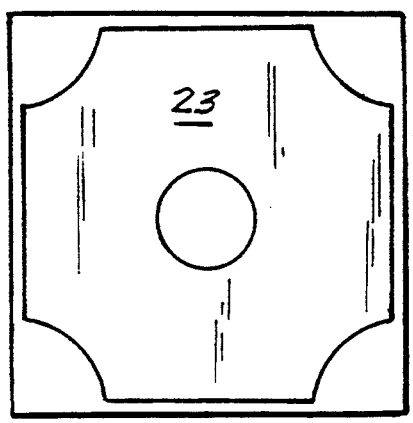
FIG. 9 is a bottom view of the module housing of FIGS. 6, 7 and 8.

As shown in FIG. 1, the entire module assembly is contained within a molded insulation housing 20 having an open top and closed bottom 21. An integral positioning pedestal 22 extends upwardly from bottom 21. After all parts are assembled within housing 20, it is filled with a silicone rubber to a level just above that of the chips, and is thereafter filled with an upper layer of epoxy which, when set, holds all parts in place and insulated from one another. As shown in FIG. 9, the housing 20 may have a metal insert 23 at its base to permit its convenient mounting to a heat sink or other support.

The prior art device of FIGS. 1 to 5 contains two spaced mounting frames 30 and 31 which may be copper stampings. Frame 30 has two diode chips 40 and 41 soldered thereto. Diode chips 40 and 41 have flat parallel, spaced, anode and cathode surfaces, each of which is metallized (not shown). The anode of chip 40 and cathode of chip 41 is soldered to the upper surface of frame 30 as by a soft solder. The chips 40 and 41 can have any size, determined by the desired current rating for the device.

In a similar manner, diode chips 42 and 43 are soldered to frame 31, with the cathode of diode 43 and anode of diode 44 soldered down.

Frames 30 and 31 have integrally formed terminal straps 50 and 51, respectively, which extend upwardly from housing 20 and at right angles to the frame bases. Terminals 50 and 51 are the a-c terminals of the bridge circuit of FIG. 4.

Thin copper straps 60 and 61 having central stress relief "U" bends are then soldered to the top electrodes of each of chips 40, 41, 42 and 43. Thus, strap 60 connects the cathode of diode 40 to the anode of diode 43 while strap 61 connects the anode of diode 41 to the cathode of diode 42.

Terminal straps 70 and 71, of the same cross-section as terminals 50 and 51, are then brazed to the ends of connection straps 60 and 61 as shown and extend upwardly and parallel to terminals 50 and 51. Terminal straps 70 and 71 are spaced from frames 30 and 31, respectively, and act as the d-c terminals of the bridge circuit as shown in FIG. 4.

Figure 2:
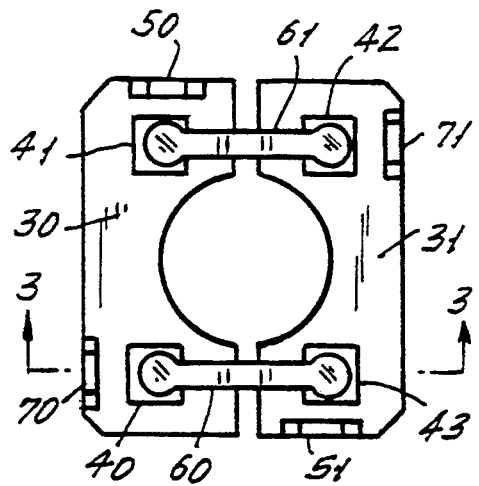
FIG. 2 is a top view of the mounting frames and connection straps of the prior art module of FIG. 1.
Figure 3:
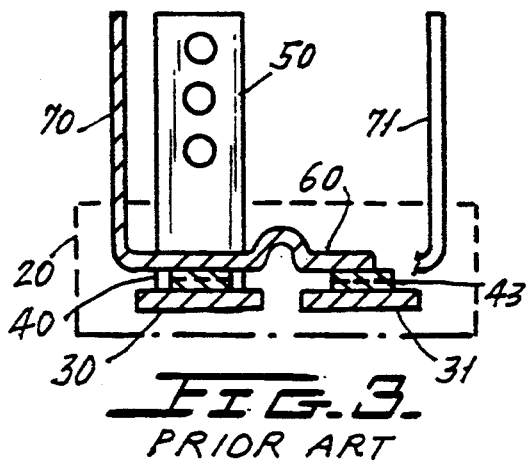
FIG. 3 is a cross-sectional view of FIG. 2 taken across the section line 2—2 in FIG. 2.

After the entire frame is subassembled, as shown in FIG. 2, it is fitted into the housing 20, over the pedestal 22 and sits on the bottom 21 of housing 20. A silicone rubber (not shown) is then poured into the housing to above the level of the chips or die 40 to 43 and connectors 60 and 61. After curing, the silicone rubber protects the chips and permits thermal expansion and movement of the chips and connectors. The housing is thereafter filled with a hard epoxy which fixes the terminals 50, 51, 70 and 71 in place relative to the housing.

Figure 5:
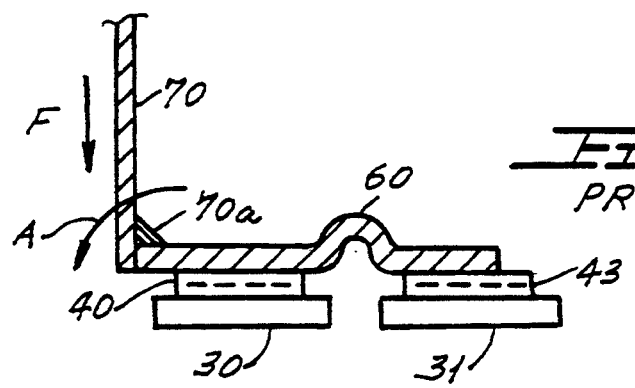
FIG. 5 illustrates the insertion force on certain ones of the chips in the module of FIGS. 1, 2 and 3.
Figure 6:
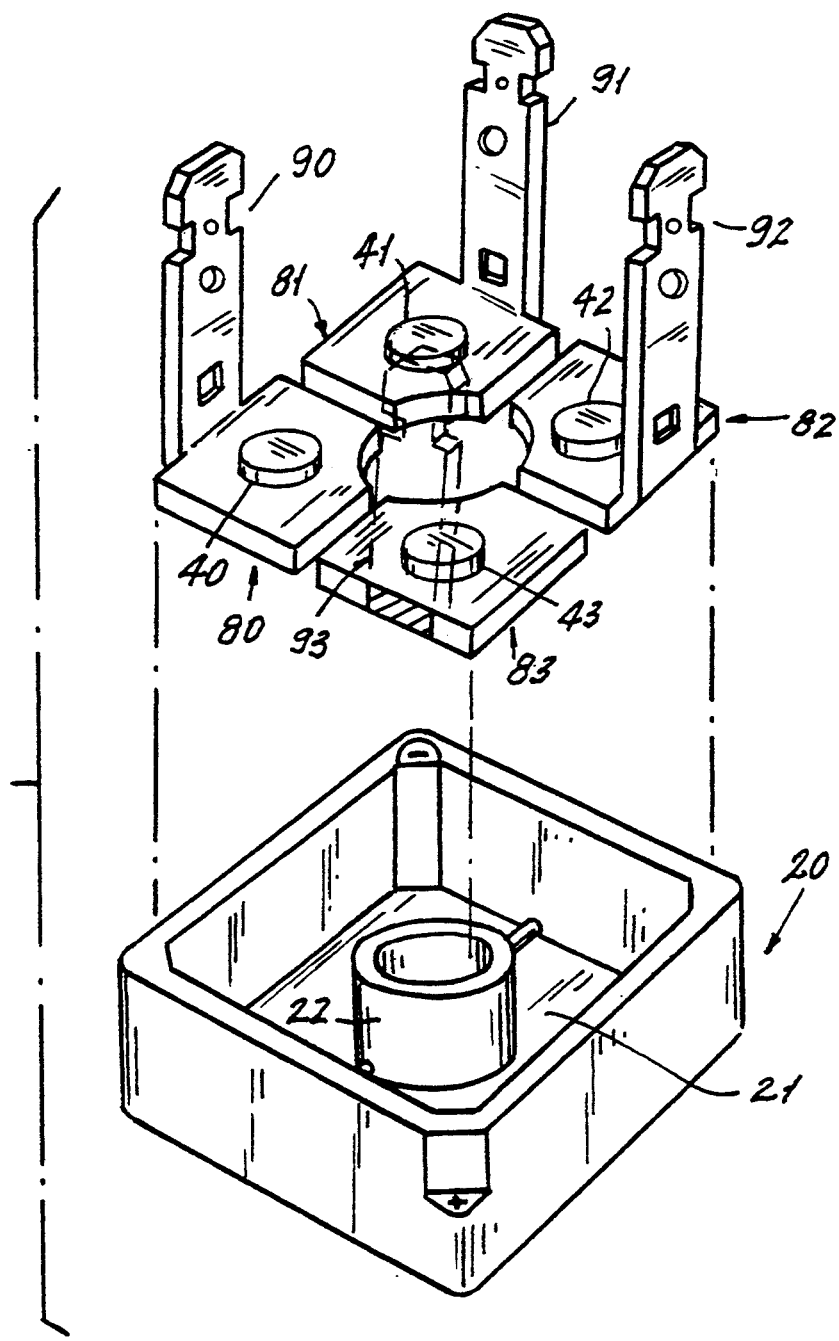
FIG. 6 is an exploded perspective view of a module employing the features of the present invention.

The prior art module is subject to failure when excessive insertion force is used to plug terminals 50, 51, 70 and 71 into a receiving fixture, and during assembly of the module. Thus, as shown in FIG. 5, the terminal 70 (brazed to connector 60 at braze 70a) is located vertically beyond the edge of die 40 so that a portion of connector 60 is cantilevered beyond the edge of die 40. Consequently, when an insertion force F is applied to terminal 70, the cantilevered section of terminal 60 can be pressed downwardly, as shown by arrow A, sufficiently to fracture die 40. A similar problem exists with die 42. Consequently, insertion force and vibration force must be limited.

A second problem with the module of FIGS. 1 to 5 is that the copper straps 60 and 61 must have a length sufficient to reach across the center-to-center spacing of the semiconductor devices. Further, the copper straps will work-harden as the U-shaped bends are opened and closed during assembly and thermal cycling.

In accordance with the present invention, an identical mounting frame is provided for each semiconductor chip, as shown in FIGS. 6 to 10. In the module of FIGS. 6 to 10, parts having the same structure as those of FIGS. 1-5 have the same identifying numerals. Thus, there is the same housing 20 and the same diode chips 40 to 43 (shown as circular die rather than square).

Four identical mounting frames 80, 81, 82 and 83 are provided (FIGS. 6, 7 and 8) which have chips 40, 41, 42 and 43, respectively, soldered to their top surfaces.

Each of the mounting frames has an identical terminal strap 90, 91, 92 and 93, respectively, bent upwardly and extending therefrom.

Figure 10:
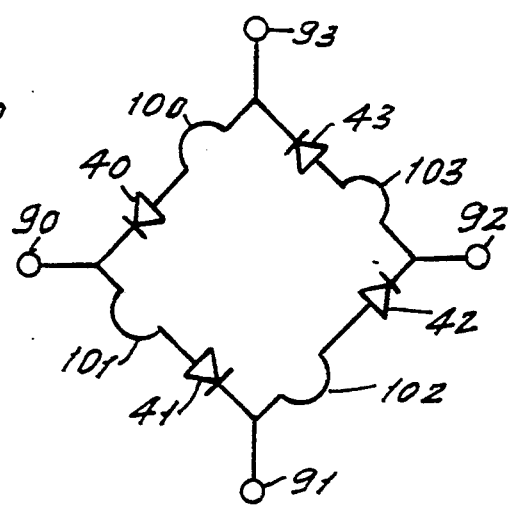
FIG. 10 is a circuit diagram of the module of FIGS. 6, 7, 8 and 9.

Four identical brass straps 100, 101, 102 and 103 (FIGS. 7 and 8) are then used to interconnect the diodes 40 to 43 to form the bridge, as is best shown in FIG. 10. More specifically, the anodes of diodes 40 and 41 are soldered down to the tops of frames 80 and 81, respectively, and the cathodes of diodes 42 and 43 are soldered down to the tops of frames 82 and 83, respectively. Brass straps then sequentially connect, by soft solder, the top surfaces of die 40 to 43 to the adjacent frames 83, 82, 81 and 80, respectively, as shown in FIGS. 7 and 10.

Figure 7:
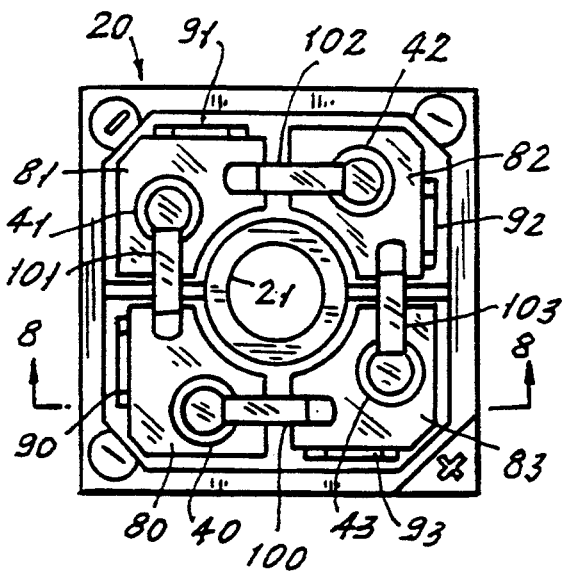
FIG. 7 is a top view of the interior of the module of FIG. 6.
Figure 8:
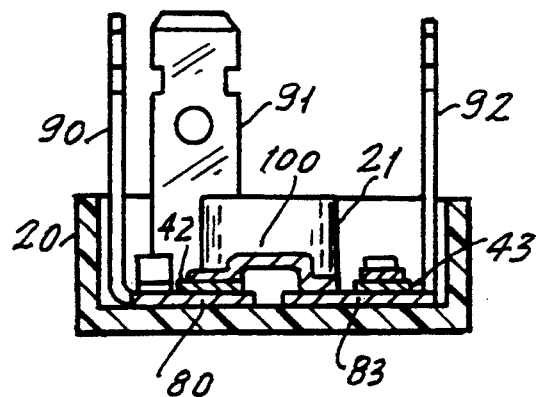
FIG. 8 is a cross-sectional view of FIG. 7 taken across the section line 8—8 in FIG. 7.

After the subassembly of FIG. 7 is completed, it is loaded into the housing 20 in the same manner as for the prior art structure, and is covered with a cured silicone rubber and the housing is thereafter filled with epoxy.

As a consequence of the novel structure, part count is reduced that is, the number of parts of different structures, permissible insertion force is increased, and the device has improved thermal performance and vibration resistance.

Figure 11:
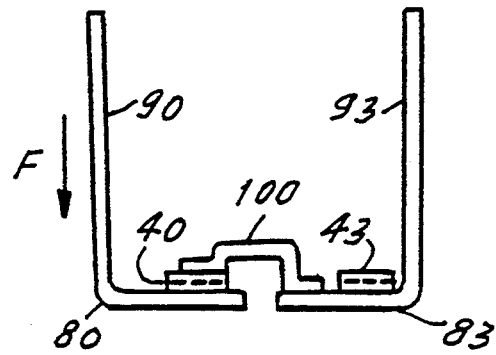
FIG. 11 is a diagram illustrating the manner in which insertion force is isolated from the chips of the module.

More specifically, as shown in FIG. 11, the insertion force "F" on terminal 90 and all other terminals 91, 92 and 93 is not applied to any die, but is resisted by the frame section 80 seated on the bottom of the housing. The brass connectors 100 through 103 are shorter than the prior art connectors 60 and 61 and have better thermal performance and are not subject to the annealing during solder-down, or to work-hardening as the prior art copper straps. Thus, the device has improved resistance to mechanical vibration and improved thermal performance.

In carrying out the invention, other kinds of die than diodes can be employed with other rectangular housing shapes and with other circuit configurations. Moreover, for higher currents, each semiconductor chip frame can employ plural parallel connected chips. Diverse semiconductor chips can also be mounted and interconnected within a common module.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device module containing a plurality of semiconductor devices, a plurality of respective mounting frames and terminals for each of said semiconductor devices, a rectangular insulation housing for receiving and insulating said semiconductor devices from one another and for positioning said plurality of terminals for external access, a plurality of flexible connector bars for interconnecting said plurality of semiconductor devices and terminals; each of said semiconductor devices comprising a thin flat wafer having terminal electrodes on each surface; each of said mounting frames comprising a thin conductive sheet member having a flat base section and an integral terminal extension extending at a right angle to said base section and from an edge of said base section; each of said mounting frames being identical to one another; each of said base sections receiving an electrode of a respective one of said semiconductor devices on the surface thereof from which its said integral terminal extends; each of said base sections being spaced from one another and being disposed in a common plane and occupying a selected area of a rectangle; each of said flexible connector bars having a first end connected to the top of a respective one of said semiconductor devices and a second end connected to the base of an adjacent base member; said rectangular insulation housing having a generally cup-shaped cross-section; said base section of said mounting frames being disposed toward the bottom of said cup-shaped insulation housing with said terminals extending beyond the open end of said cup-shaped housing; said semiconductor devices and said connection bars being disposed below the top of said cup-shaped housing.

2. The device of claim 1 wherein said base sections each occupy one quadrant of the area of said rectangular housing.

3. The device of claim 1 wherein said connection bars each have a U-shaped bend in their length to permit said bar to flex.

4. The device of claim 1 wherein said connection bars consist of thin brass straps.

5. The device of claim 1 wherein said insulation housing has a central post extending upwardly from its center; said bases having shapes which conform to the shape of said central post at their edge areas which are adjacent to said central post.

6. The device of claim 1 wherein said insulation housing is filled with an insulation compound which fixes said mounting frames in position within said housing and keeps said frames spaced from one another by a small gap.

7. The device of claim 1 wherein said housing is square and said semiconductor devices are four in number and form a bridge connection.

8. The device of claim 3 wherein said connection bars consist of thin brass straps.

9. The device of claim 3 wherein said insulation housing has a central post extending upwardly from its center; said bases having shapes which conform to the shape of said central post at their edge areas which are adjacent to said central post.

10. The device of claim 3 wherein said insulation housing is filled with an insulation compound which fixes said mounting frames in position within said housing and keeps said frames spaced from one another by a small gap.

11. The device of claim 4, wherein said insulation housing has a central post extending upwardly from its center; said bases having shapes which conform to the shape of said central post at their edge areas which are adjacent to said central post.

12. The device of claim 4 wherein said insulation housing is filled with an insulation compound which fixes said mounting frames in position within said housing and keeps said frames spaced from one another by a small gap.

13. The device of claim 5 wherein said insulation housing is filled with an insulation compound which fixes said mounting frames in position within said housing and keeps said frames spaced from one another by a small gap.

14. A semiconductor device module containing a plurality of semiconductor devices, a plurality of respective mounting frames and terminals for each of said semiconductor devices, a rectangular insulation housing for receiving and insulating said semiconductor devices from one another and for positioning said plurality of terminals for external access, a plurality of flexible connector bars for interconnecting said plurality of semiconductor devices and terminals; each of said semiconductor devices comprising a thin flat wafer having terminal electrodes on each surface; each of said mounting frames comprising a thin conductive sheet member having a flat base section and an integral terminal extension extending at a right angle to said base section and from an edge of said base section; each of said base sections being spaced from one another and being disposed in a common plane and occupying a selected area of a rectangle; said rectangular insulation housing having a generally cup-shaped cross-section; said base section of said mounting frames being disposed toward the bottom of said cup-shaped insulation housing with said terminals extending above the open end of said cup-shaped housing; said semiconductor devices and said connection bars being disposed below the top of said cup-shaped housing; characterized in that each of said mounting frames are identical to one another; each of said base sections receiving an electrode of a respective one of said semiconductor devices on the surface thereof from which its said integral terminal extends; and each of said flexible connector bars having a first end connected to the top of a respective one of said semiconductor devices and a second end connected to the base of an adjacent base member.

15. The device of claim 14 which is further characterized in that said base sections each occupy one quadrant of the area of said rectangular housing.

16. The device of claim 14 which is further characterized in that said connection bars each have a U-shaped bend in their length to permit said bar to flex.

17. The device of claim 14 which is further characterized in that said connection bars consist of thin brass straps.

18. The device of claim 14 which is further characterized in that said insulation housing has a central post extending upwardly from its center; said bases having shapes which conform to the shape of said central post at their edge areas which are adjacent to said central post.

* * * * *

UNITED STATES PATENT AND TRADEMARK OFFICE
CERTIFICATE OF CORRECTION

PATENT NO. : 5,391,919
DATED : February 21, 1995
INVENTOR(S) : Aldo Torti, et al.

It is certified that error appears in the above-indentified patent and that said Letters Patent is hereby corrected as shown below:

In the drawings:

Sheet 1, Fig. 1, add arrow to lead line 21; add reference numeral 23 to bottom inside surface of housing 20;

Sheet 2, Fig. 2, show copper straps 60 and 61 extending to terminals 70 and 71, respectively;

Sheet 2, Fig. 4, add label "PRIOR ART";

Sheet 4, Fig. 10, reverse the polarity of diodes 40 and 41.

Signed and Sealed this

Twentieth Day of June, 1995

Attest:

BRUCE LEHMAN

*Attesting Officer*  *Commissioner of Patents and Trademarks*